US009124091B2

United States Patent
Girard et al.

(10) Patent No.: US 9,124,091 B2
(45) Date of Patent: Sep. 1, 2015

(54) SURGE PROTECTOR FOR A TRANSMISSION LINE CONNECTOR

(71) Applicant: THOMSON LICENSING, Issy de Moulineaux (FR)

(72) Inventors: Henri Girard, Indianapolis, IN (US); Max W Muterspaugh, Westfield, IN (US)

(73) Assignee: THOMSON LICENSING, Issy-les Moulineaux (FR)

( * ) Notice: Subject to any disclaimer, the term of this patent is extended or adjusted under 35 U.S.C. 154(b) by 15 days.

(21) Appl. No.: 14/090,499

(22) Filed: Nov. 26, 2013

(65) Prior Publication Data

US 2015/0146336 A1     May 28, 2015

(51) Int. Cl.
 H02H 1/00   (2006.01)
 H02H 9/08   (2006.01)
 H04M 3/18   (2006.01)
 H02H 9/04   (2006.01)
 H05K 1/02   (2006.01)

(52) U.S. Cl.
CPC . *H02H 9/08* (2013.01); *H04M 3/18* (2013.01); *H02H 9/04* (2013.01); *H02H 9/046* (2013.01); *H05K 1/0257* (2013.01)

(58) Field of Classification Search
USPC .......................................... 361/117–120, 127
See application file for complete search history.

(56) References Cited

U.S. PATENT DOCUMENTS

| | | | |
|---|---|---|---|
| 4,586,104 A | 4/1986 | Standler | |
| 5,278,720 A | 1/1994 | Bird | |
| 5,475,346 A | 12/1995 | Mullett | |
| 5,896,265 A * | 4/1999 | Glaser et al. | 361/119 |
| 5,982,602 A | 11/1999 | Tellas et al. | |
| 7,535,685 B2 | 5/2009 | Sandahl et al. | |
| 8,125,299 B2 | 2/2012 | Alkan | |
| 8,179,654 B2 | 5/2012 | Tsao et al. | |
| 2003/0072121 A1 | 4/2003 | Bartel et al. | |
| 2004/0145849 A1 | 7/2004 | Chang et al. | |
| 2005/0243493 A1 * | 11/2005 | Inauen | 361/118 |
| 2011/0080683 A1 | 4/2011 | Jones et al. | |
| 2013/0111539 A1 * | 5/2013 | Egan et al. | 725/151 |
| 2014/0211348 A1 * | 7/2014 | Wang et al. | 361/56 |

* cited by examiner

*Primary Examiner* — Danny Nguyen

(74) *Attorney, Agent, or Firm* — Robert D. Shedd; Shabtay S. Henig

(57) ABSTRACT

An F connector coupled to a transmission line applies a radio frequency (RF) signal to an RF input of a filter of a set-top box via an impedance matching network that includes a first inductor and a second inductor that are coupled in series. A capacitor and a third inductor are coupled in parallel between a discharge tube and a junction terminal that is interposed between the series coupled inductors for protecting electronic components such as the filter from a voltage surge developed in the transmission line.

7 Claims, 3 Drawing Sheets

US 9,124,091 B2

SURGE PROTECTOR FOR A TRANSMISSION LINE CONNECTOR

FIELD OF THE INVENTION

The invention relates to a surge protector coupled to a transmission line connector.

BACKGROUND OF THE INVENTION

A radio frequency (RF) input signal is typically applied to an input of a home entertainment device, for example, a set-top box via an external coaxial cable, for example, a Multimedia over Coax Alliance (MoCA) cable, having a terminating coaxial connector known as F connector. The set-top box contains electronic components which may be vulnerable to damage from electrical surges. Surges in transmission line voltages, as well as noise, can change the operating range of the components and severely damage and/or destroy them. There are many sources which can cause harmful electrical energy surges. One source is RF interference that can be coupled to transmission lines from a multitude of sources. The transmission lines act as large antennas that may extend over several miles, thereby collecting a significant amount of RF noise power from such sources as radio broadcast antennas. Another source could be lightening. Therefore, it may be desirable to interpose an RF surge suppression device, forming direct current (DC) short or low impedance when a surge occurs. The RF surge suppression device may be coupled to an output of the F connector.

It may be desirable to have the F connector mounted at some distance above a printed circuit board (PCB) of the set-top box, for example, to facilitate easier manufacturing and/or more convenient placement or usage of a lower cost implementation of the connector. In such arrangement, the lead that goes from a center conductor of the connector to a pad in the PCB, the rest of the F connector and the RF surge suppression device may exhibit a reactance that may not be negligible for impedance matching purposes. Additionally, at the PCB, the pad may be relatively large to facilitate machine or reflow soldering. This pad may introduce a stray capacitance to ground that also may not be negligible.

A receiver, such as the set-top box, may receive through the connector an input signal transmitted in a multiple transmission mode system covering a wide range of frequencies, for example, up to 2.15 GHz. It may be desirable to avoid significant input return loss as a result of the aforementioned reactance of the network that includes the connector and the RF surge suppression device. Return loss is a measurement of how well the impedance of a load, including, for example, a filter that is driven by the network, including the connector and the RF surge suppression device, is matched to the characteristic impedance of the network. The return loss is a number associated with a corresponding interface that is calculated from the reflection caused at the corresponding interface as a result of an impedance mismatch. The return loss is usually expressed as a ratio in decibels (dB).

SUMMARY OF THE INVENTION

A network for applying a source of a radio frequency (RF) signal to a signal processing stage, forming a load with respect to the network, includes a first inductor coupled to the load. A transmission line connector is responsive to the RF signal and coupled to the first inductor for coupling the RF signal to the load, during normal operation. The connector is susceptible to couple a surge voltage to the first inductor, when the surge voltage occurs. The network includes a surge suppressing threshold device and a second inductor coupled to the connector for coupling the surge suppressing threshold device to the connector to suppress the surge voltage, when the surge voltage causes the surge suppressing threshold device to turn on. A capacitor is coupled to the second inductor to form a parallel resonant circuit for improving return loss at an interface of the network with one of the RF signal source and the load.

BRIEF DESCRIPTION OF THE DRAWINGS

The preferred embodiment of the present invention will be described below in more detail with reference to the accompanying drawings in which.

DETAILED DESCRIPTION

Figure 1:
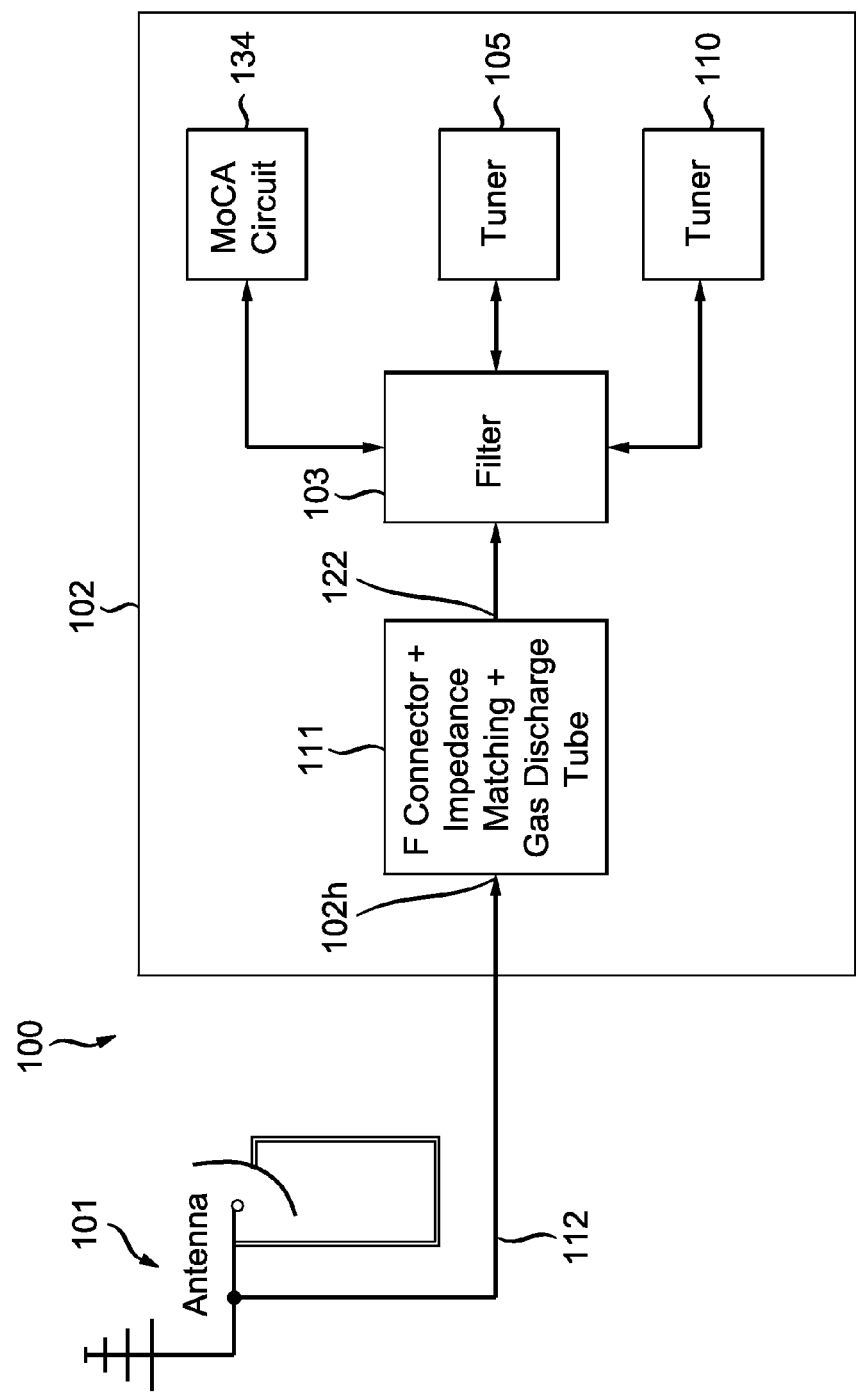
FIG. 1 illustrates, partially in a block diagram, a signal receiving device, embodying an aspects of the invention.

FIG. 1 illustrates, partially in a block diagram, a signal receiving device 100 forming, for example, a set-top box 102, that includes a network 111, embodying an inventive feature. Signal receiving device 100 primarily receives signals from one or more satellites as well as multiple television broadcast transmission sites, not shown. The signals are provided by one or more service providers and represent broadcast audio and video programs and content. Signal receiving device 100 includes components that reside for satellite reception both inside and outside a user's premises. In cable reception the components may reside only inside a user's premises. One or more components may be integrated with a display device, such as a television or display monitor, not shown. An outdoor unit (ODU) 101 receives signals from satellites and from terrestrial transmission towers through an over the air and/or near earth orbit communications link. ODU 101 is connected to set top box 102 via a transmission line 112 having a characteristic impedance of, for example, 75 Ohm. Within set top box 102, an input RF F connector 102a, not shown in details, is coupled to a filter 103 forming a load of, for example, 75 Ohm to network 111 at a terminal 122. For example, filter 103 is coupled to several signal processing paths that include a tuner 105 and a tuner 110. Filter 103 may also be coupled to a MoCA circuit 134.

Satellite or cable network signal streams, each containing a plurality of channels, are received by ODU 101. ODU 101 includes a dish for capturing and focusing the propagated radio wave from the atmosphere onto one or more antennas contained within a structure known as a low noise block converter (LNB). For example, in the case of satellite signals, ODU 101 may be configured to receive the signal streams from satellite transponders located on one or more satellites. In a preferred embodiment for satellite receivers, two sets of sixteen channels are received by ODU 101, and converted, using one or more LNBs to a frequency range between 950 Megahertz (MHz) and 2,150 MHz, referred to as L-band. ODU 101 also includes a terrestrial antenna for receiving over the air broadcasts. In a preferred embodiment of the satellite example, ODU 101 includes an antenna for receiving signals in the network's desired frequency range. In the cable network example, the cable head end provides typically signals in one frequency range. A different non overlapping frequency range is reserved for the set top box Data Over Cable Service Interface Specification (DOCSIS) channel.

ODU 101 provides a converted signal stream to set top box 102 through RF co-axial cable 112. The converted signal stream is provided to filter 103 via network 111, embodying an inventive feature, that is explained later on in more details. The frequency response properties of filter 103 include a high pass filter and a separate low pass filter, not shown, such that the frequency pass bands of each do not overlap. The arrangement, often referred to as a triplexer, allows for a separation, through signal filtering including the incoming satellite signal and/or a MoCA signal. For the embodiment of the cable network, a band pass filter portion allows a MoCA signal in a frequency range from 1125 MHz to 1650 MHz as well as a cable video and internet via cable, for example, DOCSIS signal to pass to filter 103.

Figure 2:
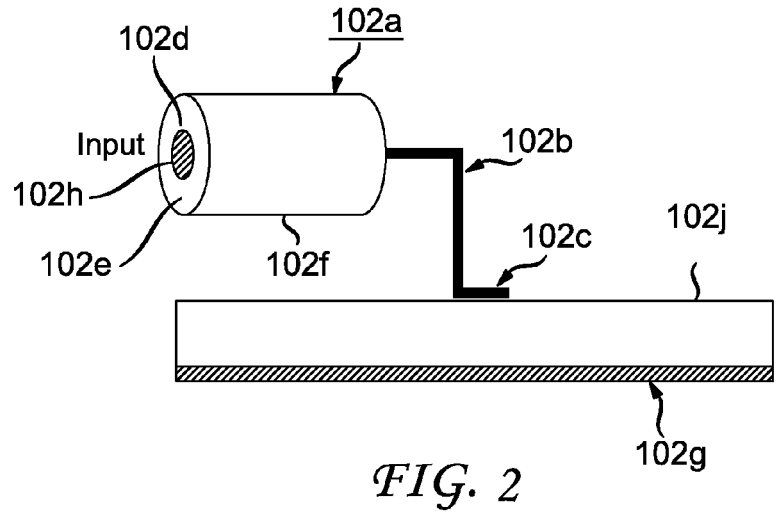
FIG. 2 illustrates a connector for connecting a RF signal to the a set-top box.

An equivalent mechanical assembly diagram that includes RF F connector 102a is shown in FIG. 2. Similar symbols and numerals in FIGS. 1 and 2 indicate similar items or functions. RF F connector 102a of FIG. 1 that is used for connecting RF co-axial cable 112 to set top box 102 has a relatively long output lead 102b of FIG. 2 that connects to a PCB top surface 102j internal to the set top box 102 of FIG. 1. Lead 102b requires a relatively large pad 102c of FIG. 2 on PCB top surface 102j. Lead 102b introduces a series inductance and pad 102c introduces an undesired shunt capacitance, not shown. RF F connector 102a is a coaxial assembly with a center conductor 102d, an insulator 102e and an outer metallic tube 102f with threads, not shown, to allow connection to coaxial cable 112 of FIG. 1 fitted with a mating F connector, not shown. Center conductor 102d emerges in lead 102b which is formed to engage copper pad 102c on the PCB. PCB pad 102c is relatively large for mechanical strength and proper soldering. The opposite side of the PCB is provided with a copper foil 102g forming a portion of a common conductor referred to as ground of set-top box 102 of FIG. 1 to provide electrical shielding of the circuitry.

Figure 3:
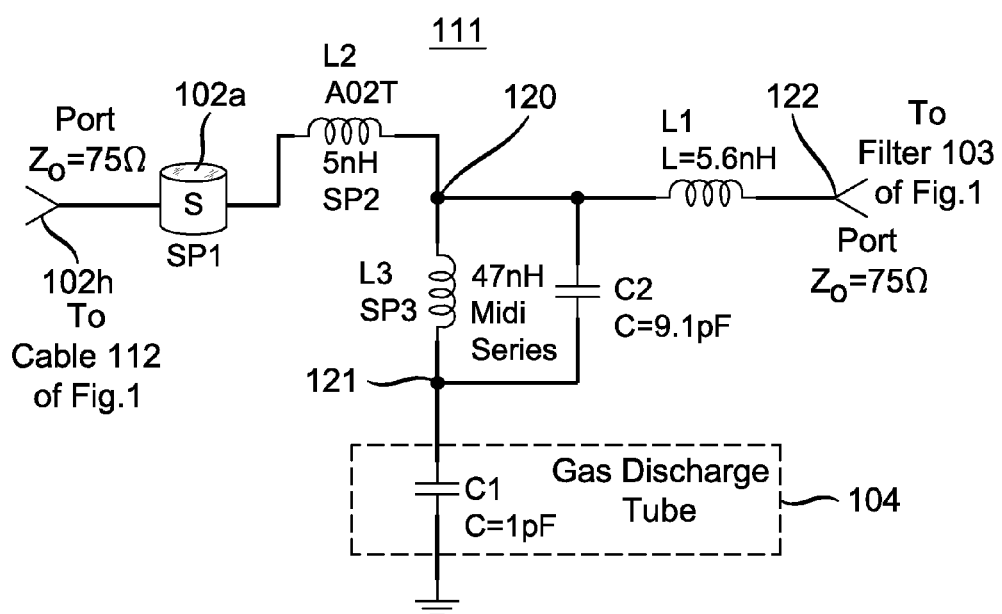
FIG. 3 illustrates a circuit diagram of an impedance matching arrangement, embodying an inventive feature, that includes a surge protector.

FIG. 3 illustrates a detailed circuit diagram of network 111, embodying an inventive feature, of FIG. 1. Network 111 of FIG. 3 includes actual components or their equivalent S-parameter models. Network 111 is formed between input terminal 102h of connector 102a of FIG. 2 and input terminal 122 of filter 103 of FIG. 1. Similar symbols and numerals in FIGS. 1, 2 and 3 indicate similar items or functions.

A gas discharge tube forming an RF surge suppression device 104 is coupled to pad 102c of FIG. 2. Surge suppression device 104 of FIG. 3 forms a DC short, between pad 102c of FIG. 2 to which lead 102b is soldered and the ground potential of copper foil 102g when a surge occurs in transmission line 112. For any arc related voltage developed in pad 102c that is over about 100 volts, the DC short is formed by an internal arc of device 104 of FIG. 3. Thus, a surge voltage of thousands of volts gets clipped at a lower voltage on pad 102c of FIG. 2. In this way, the components of set-top box 102 of FIG. 1 will be protected from harmful electrical energy emitted from the above described sources. In the absence of surge, in other words, during normal operation, surge suppression device 104 of FIG. 3 forms an open circuit for DC. Preferably, surge suppression device 104 would be placed very close to lead 102b of FIG. 2.

Connector 102a of FIG. 3 is not perfect resistive impedance over the large frequency range of operation but forms reactive impedance. Additionally, surge suppression device 104 has an inherent capacitance C1. Each of the reactive impedance of connector 102a and the inherent capacitance of surge suppression device 104 could degrade the required insertion loss parameter and/or the return loss parameter at an input terminal 102h of connector 102a and/or at input terminal 122 of filter 103 of FIG. 1.

Connector 102a that includes lead 102b of FIG. 2 is represented in the circuit of FIG. 3 by its S-parameters model SP1 that can be obtained by measurements or given by a manufacturer of connector 102a. As explained later on, S-parameters model SP1 is used in a simulation. A 5 nH air core inductor L2 of the type AO2T made by Coilcraft is coupled between lead 102b of FIG. 2. Inductor L2 is represented in the simulation by its S-parameters model SP2 that can be obtained by measurements or given by a manufacturer. Inductor L2 is coupled via a junction terminal 120 of FIG. 3 to an inductor L1 to form a series coupled signal path between input terminal 102h and terminal 122 of filter 103 of FIG. 1. Inductor L2 compensates for undesirable effects exhibited by the imperfection of the electrical characteristics of connector 102a. In this way, an input impedance matching at input terminal 102h of FIG. 2 with respect to a corresponding impedance of mating cable 112 of FIG. 1 is improved. Inductor L1 of 5.6 nH further improves the output return loss at terminal 122.

A parallel coupled arrangement of a Midi series 47 nH inductor L3 made by Coilcraft and a capacitor C2 that forms a resonant circuit is coupled between junction terminal 120 and a junction terminal 121. Inductor L3 is represented in the simulation by its S-parameters model SP3 that can be obtained by measurements or provided by its manufacturer. The resonant circuit of inductor L3 and capacitor C2 is coupled via junction terminal 121 to gas discharge tube 104 of the type CG590 MS made by the Littlefuse company that is modeled in the simulation by its low value 1 pF inherent capacitance C1, also shown in FIG. 3. Inductor L3, advantageously, prevents capacitance C1 of gas discharge tube 104 from degrading the impedance matching at input terminal 122 of filter 103 of FIG. 1.

The requirement from gas discharge tube 104 is to protect against a voltage surge of at most 7kV with 10 microsecond rise time and 700 microseconds fall time. The equivalent series resistance of gas discharge tube 104 is about 27 ohms, when conductive. Series coupled inductors L2, L3 and gas discharge tube 104, advantageously, forms low impedance in the low frequency range of a current surge when a voltage surge causes gas discharge tube 104 to become conductive.

In carrying out an inventive feature, 9.1 pF capacitor C2 that is coupled in parallel with Midi series inductor L2 to form a parallel resonant circuit reduce an effect of a resonance observed between inductor L2 and equivalent capacitance C1 of gas discharge tube 104 in normal operation when gas discharge tube 104 is non-conductive. But for capacitor C2, resonance could have, disadvantageously, occurred by an operation of a series resonant circuit.

A preferred way of selecting inductors L1, L2 and L3 and capacitor C2 is now described. Initially the S-parameter model of connector 102a is obtained from the manufacturer or by measurements. In the next step, tentative or initial values for inductors L1, L2 and L3 and capacitor C2 are selected. Then, a program such as Genesys Momentum made by Agilent is applied to the S-parameter models of the various components. This program is capable of optimizing the values of inductors L1, L2 and L3 and capacitor C2 for obtaining optimized values of the return loss and insertion loss at each of input terminal 102h and terminal 122.

In the next step, the optimized values of inductors L1, L2 and L3 and capacitor C2 are replaced by S-parameter models of available components having similar values as the optimized values produced by the Genesys Momentum program. Then the program is run again with the new S-parameter values of the newly selected inductors L1, L2 and L3 and capacitor C2.

It may be desirable to have an impedance matching at input terminal 102h of connector 102 such that the value of the input impedance at input terminal 102h of network 111 is close to the value of the characteristic impedance, for example, 75 Ohm of cable 112 of FIG. 1 such that a return loss at terminal 102h of better than −10 dB over most of the frequency band of interest is obtained. Similarly, it may be desirable to have an impedance matching at input terminal 122 of FIG. 3 such that the value of the input impedance at input terminal 122 of network 111 is close to the value of an impedance of, for example, an input stage, not shown, of filter 103 of FIG. 1. The value of the impedance at terminal 122 of FIG. 3 need not be the same as at terminal 102h. Because network 111 has negligible gain/loss and has matched impedances at each of terminals 102h and 122, network 111 of FIG. 3 is transparent to the receiver electronics.

Figure 4:
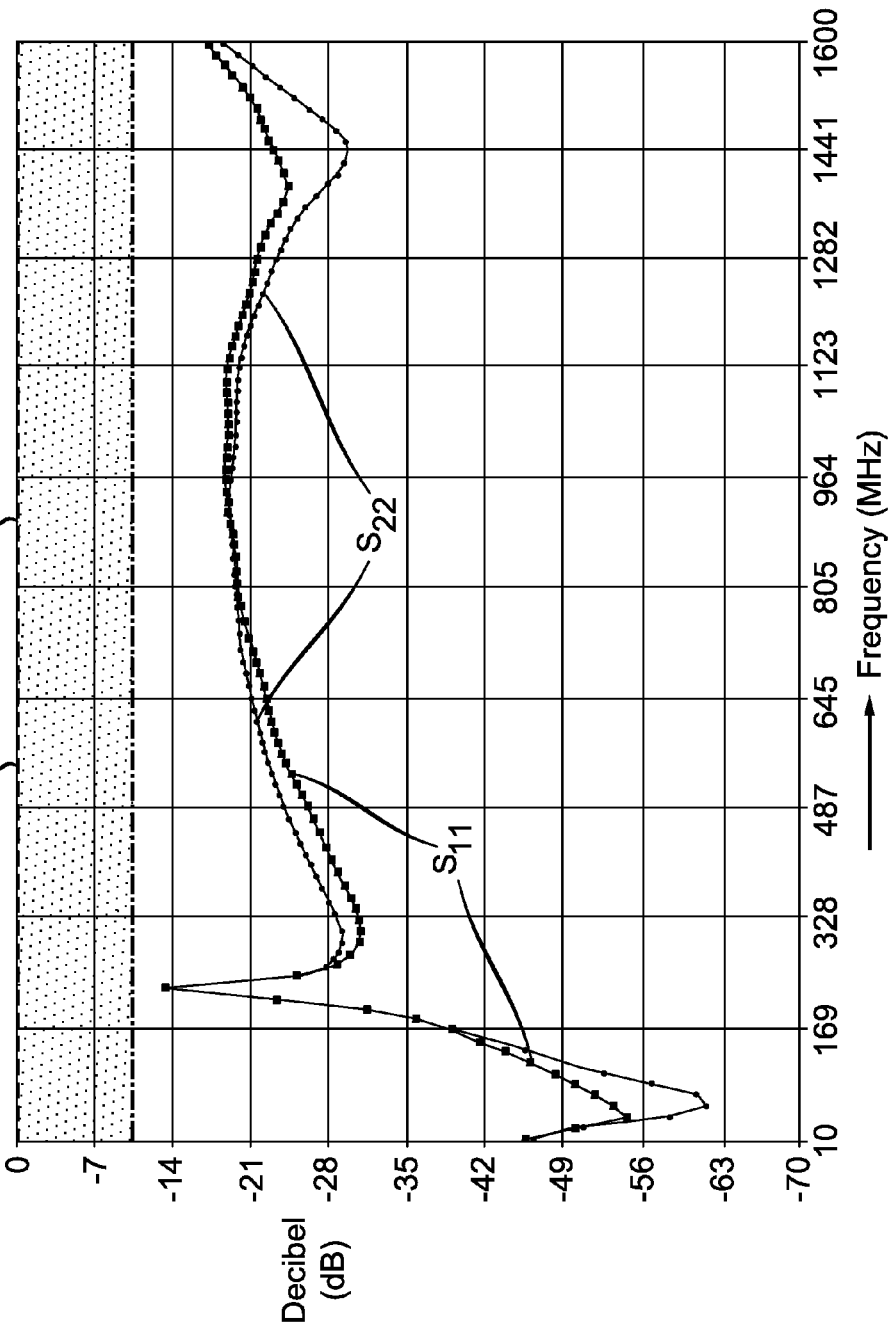
FIG. 4 illustrates a graphs obtained from a simulation that depict variations of corresponding S-parameters of the circuit of FIG. 3.

FIG. 4 illustrates graphs obtained from the aforementioned simulation that depict variations of the corresponding S-parameters of the circuit of FIG. 3. Similar symbols and numerals in FIG. 1-4 indicate similar items or functions. As shown in FIG. 4, over most of the frequency range, for example, over 75%, between 10 MHz and 1600 MHz, the return loss S-parameter $S_{11}$ at input terminal 102h of FIG. 3 is better than −10 dB; the return loss S-parameter $S_{22}$ of FIG. 4 at terminal 122 of FIG. 3 is better than −10 dB; and the insertion loss S-parameters $S_{12}$ of FIG. 4, representing reverse insertion loss from terminal 102h of FIG. 3 to terminal 122 is better than −0.1 dB and is equal to $S_{21}$ of FIG. 4, representing reverse insertion loss from terminal 122 of FIG. 3 to terminal 102h.

The invention claimed is:

1. A network for applying a source of a radio frequency (RF) signal to a signal processing stage forming a load with respect to said network, comprising:
    a first inductor coupled to said load;
    a transmission line connector responsive to said RF signal and coupled to said first inductor for compensating against an impedance mismatch between said connector and a transmission line, when said transmission line is coupled to said connector, and for coupling said RF signal to said load, during normal operation, said connector being susceptible to couple a surge voltage to said first inductor, when said surge voltage occurs;
    a surge suppressing threshold device;
    a second inductor coupled via said first inductor to said connector for coupling said surge suppressing threshold device to said connector to suppress said surge voltage, when said surge voltage causes said surge suppressing threshold device to turn on, said second inductor being capable of enhancing isolation of a capacitance, formed between a pair of terminals of said surge suppressing threshold device, from a signal path formed between said connector and said load at each frequency of said RF signal that is within at least 75% of a range of frequencies between 10 and 1600 MHz; and
    a capacitor coupled in series with said capacitance that is formed between said pair of terminals and coupled to said second inductor to form a parallel resonant circuit.

2. A network according to claim 1 further comprising, a third inductor coupled in series with said first inductor between said connector and said load, wherein said second inductor is coupled to a junction terminal between said first and third inductors and remote from each of said RF signal source and said load.

3. A network for applying a source of a radio frequency (RF) signal to a signal processing stage forming a load with respect to said network, comprising:
    a first inductor coupled to said load;
    a transmission line connector responsive to said RF signal and coupled to said first inductor for coupling said RF signal to said load, during normal operation, said connector being susceptible to couple a surge voltage to said first inductor, when said surge voltage occurs;
    a surge suppressing threshold device;
    a second inductor coupled to said connector for coupling said surge suppressing threshold device to said connector to suppress said surge voltage, when said surge voltage causes said surge suppressing threshold device to turn on; and
    a capacitor coupled to said second inductor to form a parallel resonant circuit for improving return loss at an interface of said network with one of said RF signal source and said load, wherein said return loss is better than −10 decibel at said interface of said network with said one of said RF signal source and said load over at least 75% of a range of frequencies between 10 and 1600 MHz.

4. A network according to claim 1 wherein said surge suppressing threshold device comprises a surge discharge tube.

5. A network according to claim 1 wherein said connector comprises an F connector.

6. A network according to claim 1 wherein said connector is mounted at a distance above a printed circuit board (PCB).

7. A network according to claim 1 wherein said signal processing stage is included in a set-top box.

* * * * *